(12) United States Patent
Warner

(10) Patent No.: US 6,940,304 B2
(45) Date of Patent: *Sep. 6, 2005

(54) ADAPTIVE THRESHOLD LOGIC CIRCUIT

(75) Inventor: David J. Warner, Addlestone (GB)

(73) Assignee: Micron Technology, Inc., Boise, ID (US)

( * ) Notice: Subject to any disclaimer, the term of this patent is extended or adjusted under 35 U.S.C. 154(b) by 47 days.

This patent is subject to a terminal disclaimer.

(21) Appl. No.: 10/292,517

(22) Filed: Nov. 13, 2002

(65) Prior Publication Data

US 2003/0067324 A1 Apr. 10, 2003

Related U.S. Application Data

(63) Continuation of application No. 09/805,100, filed on Mar. 14, 2001, now Pat. No. 6,498,510.

(51) Int. Cl.[7] .............................................. H03K 19/003
(52) U.S. Cl. ........................................ 326/31; 326/81
(58) Field of Search .......................... 326/80–81, 62–63, 326/68, 35–36, 31, 34

(56) References Cited

U.S. PATENT DOCUMENTS

| | | |
|---|---|---|
| 4,506,168 A | 3/1985 | Uya |
| 4,539,489 A | 9/1985 | Vaughn |
| 4,603,264 A | 7/1986 | Nakano |
| 5,240,196 A | 8/1993 | Baarfuesser |
| 5,444,392 A | 8/1995 | Sommer et al. |
| 5,654,664 A * | 8/1997 | Park et al. .................. 327/531 |
| 5,751,166 A | 5/1998 | Shieh et al. |
| 5,856,750 A | 1/1999 | Koseki |
| 5,886,556 A | 3/1999 | Ganger et al. |
| 5,973,521 A | 10/1999 | Kim et al. |
| 6,118,348 A | 9/2000 | Narahara |
| 6,147,540 A | 11/2000 | Coddinton |
| 6,181,172 B1 | 1/2001 | Callahan |
| 6,310,492 B1 * | 10/2001 | Ikoma et al. .................. 326/81 |
| 6,515,507 B1 * | 2/2003 | Patel et al. .................... 326/38 |

FOREIGN PATENT DOCUMENTS

| | | | | |
|---|---|---|---|---|
| JP | 05284004 A | * | 10/1993 | .................. 326/80 |
| JP | 409064700 A | | 3/1997 | |

* cited by examiner

Primary Examiner—James H. Cho
(74) Attorney, Agent, or Firm—Dickstein Shapiro Morin & Oshinsky LLP

(57) ABSTRACT

An adaptive threshold logic circuit is provided in which the switching threshold levels of the logic circuit are automatically changed to accommodate variations in the level of applied data signals to the switching circuit. A detector stage detects the voltage level of the incoming data signals and selectively adjusts the threshold level of a threshold adaptor stage in accordance with the output of the detector stage. The threshold adaptor stage is essentially an adaptive CMOS inverter having various switching paths turned on or off in accordance with the output of the detector stage.

18 Claims, 4 Drawing Sheets

US 6,940,304 B2

ADAPTIVE THRESHOLD LOGIC CIRCUIT

CROSS REFERENCE TO RELATED APPLICATIONS

This application is a continuation of application Ser. No. 09/805,100, filed Mar. 14, 2001, now U.S. Pat. No. 6,498, 510, the subject matter of which is incorporated by reference herein.

FIELD OF THE INVENTION

The present invention relates to a logic circuit which is capable of adjusting a switching threshold in accordance with the voltage level of applied input logic signals.

BACKGROUND OF THE INVENTION

Digital logic circuits are sometimes arranged such that a first logic circuit operates with one supply voltage, e.g., 3.3 volts, while another circuit supplying input logic signals to the first logic circuit operates with a different supply voltage, e.g., 1.8 volts. In such a case, the logic signals supplied to the first logic circuit are incompatible with the switching threshold of the first logic circuit, which is set for applied input signals of 3.3 volts, causing erroneous and undesired switching operations.

A simple way of adjusting a switching threshold of a logic circuit to handle input logic signals of different voltage levels is needed.

BRIEF SUMMARY OF THE INVENTION

The present invention provides a simple way of adjusting the switching threshold of a logic circuit in accordance with the signal level of input logic signals which are applied to it.

The invention provides a logic circuit with a voltage level detector stage which detects the supply voltage of a circuit supplying applied input signals, and an adaptive threshold stage which, in response to the output of the detector stage, selects a switching threshold level for switching operations in response to the applied logic input signals.

The adaptive threshold stage may be formed as a CMOS inverter circuit in which certain transistors are turned on or off in response to the output of the detector stage to thereby alter the inverter switching threshold.

These and other features and advantages of the invention will be more clearly seen from the following description of the invention which is provided in conjunction with the accompanying drawings.

DETAILED DESCRIPTION OF THE INVENTION

Figure 1:
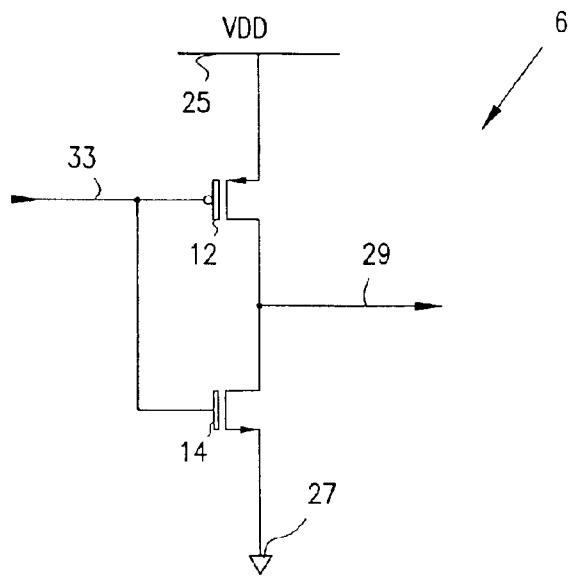
FIG. 1 depicts a conventional CMOS inverter circuit.

FIG. 1 is an electrical schematic drawing of a typical CMOS inverter 6 which switches states in response to switching states of logic signals applied to input line 33. The inverter 6 includes a p-channel MOS transistor 12 serially connected to an n-channel MOS transistor 14, with the serial connection of the two transistors being connected between $V_{DD}$ 25 and ground 27. The CMOS inverter 6 provides inverted output logic signals on line 29 in response to the states of logic signals applied to input line 33.

The transistors 12 and 14 are configured such that when $V_{DD}$ is at one voltage level, e.g., 3.3 volts, and the input logic signals on line 33 transition between voltage levels of zero and 3.3 volts, the inverted output signals on line 29 are likewise transitioning between 3.3 volts and zero volts with relatively low signal skew or waveform distortion because the switching threshold of transistors 12 and 14 is well matched to the expected zero to 3.3 volt transitions of the signals on line 33.

Figure 2:
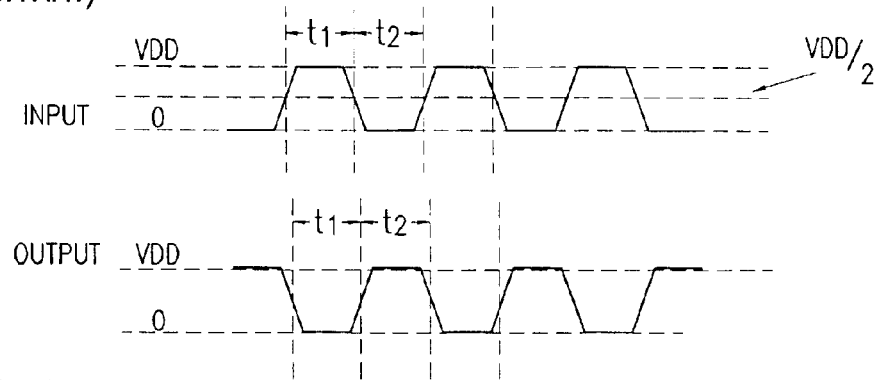
FIG. 2 and FIG. 3 are timing diagrams illustrating operation of the FIG. 1 circuit.

This is illustrated in FIG. 2 which shows that the output of inverter 6 begins to transition state in response to an input logic signal reaching a value of approximately $V_{DD}/2$ on rising and falling edges of the input logic signal. In actuality, there may be a slight respective offset from $V_{DD}/2$ for the switching threshold on the rising and falling edges of the input signal. In other words, the switching threshold is approximately centered between zero volts and $V_{DD}$. The cycle of the output signal waveform is essentially the same as that of the input signal waveform, that is $t_1=t_2$.

Figure 3:
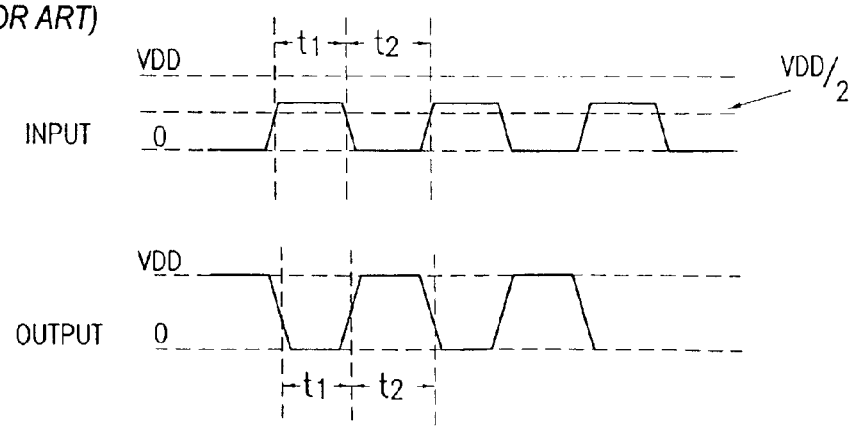

When, however, an input logic signal transitions between zero volts and a voltage level lower than $V_{DD}$, e.g., 1.8 volts, as shown in FIG. 3, the output signal waveform is distorted because the switching threshold of inverter 6 remains at essentially $V_{DD}/2$ which is not centered between zero and 1.8 volts. As a result, the duty cycle of the output signal waveform is different from the duty cycle of the applied input signal, and the output signal on line 29 is no longer a true representation of the inverted input signal on line 33, i.e., $t_1 \neq t_2$.

The present invention avoids this problem and provides an adaptive logic circuit which can change the switching threshold in response to the voltage level of the applied input signal so that the output signal faithfully transitions with minimal switching threshold signal distortions in response to signal transitions of an applied input signal.

For purposes of simplifying discussion, the adaptive logic circuit of the invention will be illustrated as an adaptive CMOS inverter circuit, but the invention can be applied to any logic circuit having switching thresholds.

Figure 4:
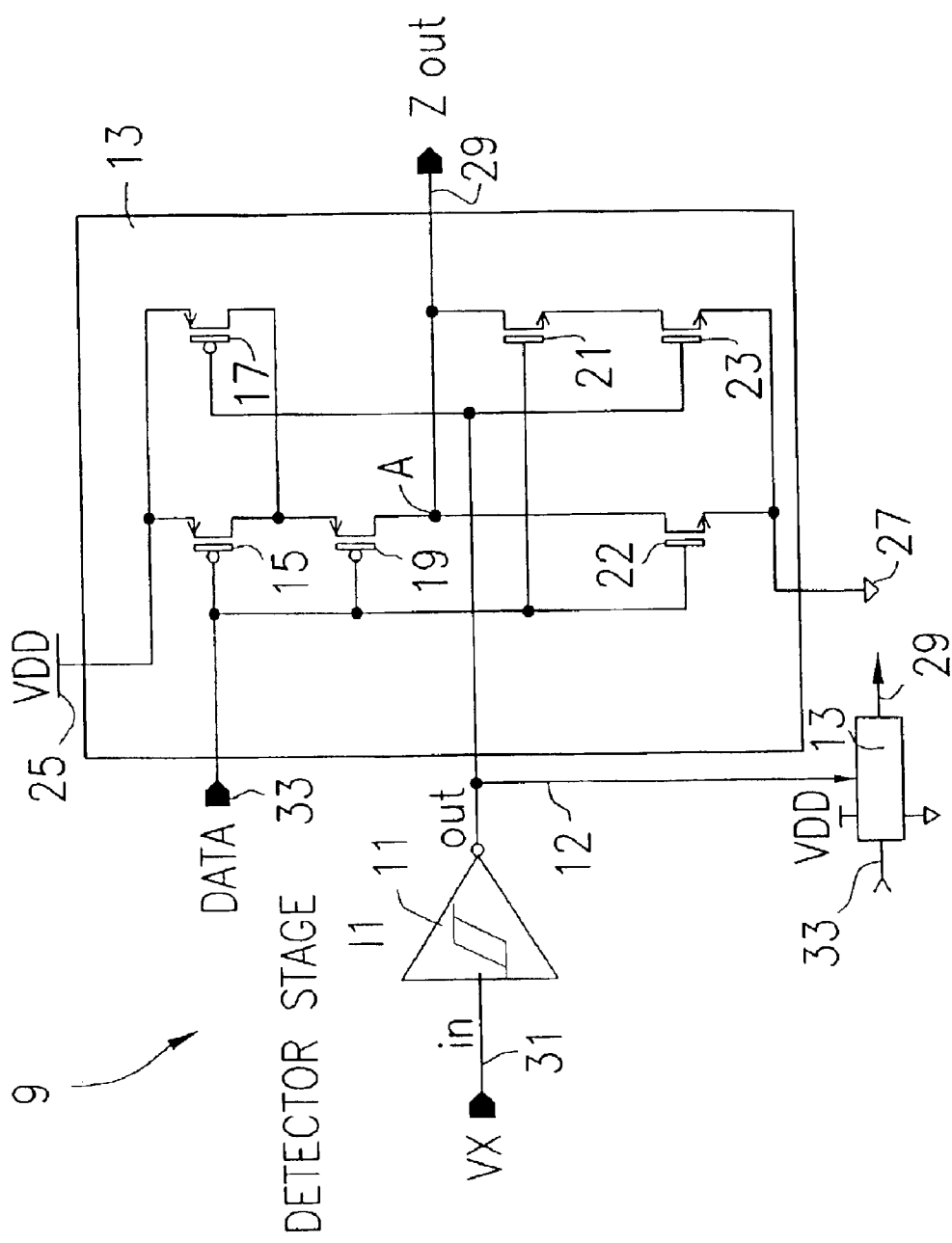
FIG. 4 depicts an adaptive threshold logic circuit in accordance with an exemplary embodiment of the invention.

Referring now to FIG. 4, an exemplary embodiment of the invention is illustrated. A CMOS inverter 9 is illustrated as including a detector stage 11 which is formed as a threshold circuit, and a threshold adapter stage 13 which is defined to accept data from a downstream logic circuit on input line 33, and provide an output signal on output line 29.

To accommodate different levels of possible input signal potential at input line 33, the invention employs detector stage 11, which may be formed as a Schmitt trigger. This is an inverter stage which has a predefined threshold which may be preset. An input to detector stage 11 is from an input line $V_X$ which receives a voltage signal which is the supply voltage of a downstream logic circuit which provides logic signals at input line 33. If $V_X$ is at a level of VDD, e.g., 3.3 volts, indicating that the downstream circuit potential is at the same level as the $V_{DD}$ of the threshold adaptor stage 13, the detector stage produces a first output signal at its output. If, on the other hand, a signal at the input terminal $V_X$ is below $V_{DD}$, by a specified percentage as set as a threshold of the detector stage 11, the detector stage produces a second output signal.

The switching threshold of the detector stage 11 can be set so that the detector stage will switch when the voltage applied to the input $V_X$ is below by a certain percentage the supply voltage $V_{DD}$ of the threshold adaptor stage 13, e.g., a voltage of 70% of $V_{DD}$.

The threshold adaptor stage 13 as shown in FIG. 4 includes p-channel MOS transistors 15, 17, 19, and n-channel MOS transistors 21, 22, and 23. Transistors 15, 19 and 22 are connected between the voltage potential $V_{DD}$ 25 and ground 27. The gates of p-channel transistors 15 and 19 are coupled together and are further coupled to the input line 33. The gate of n-channel transistor 22 is also coupled to the input line 33.

P-channel transistor 17 is connected in parallel with the p-channel transistor 15, and the gate of transistor 17 is connected to the output of the detector stage 11. The connection between the serially connected transistors 19 and 22 forms a node A which is in turn connected to the output line 29. Connected between the output line 29 and ground 27 is a pair of serially connected n-channel transistors 21 and 23. N-channel transistor 22 is connected between node A and ground, and is also connected in parallel with the series connection of transistors 21 and 23.

The gate of transistor 23 is also connected to the output of detector stage 11, and the gate of transistor 21 is connected to the line input 33. Thus, adaptor stage 13 is a CMOS inverter formed by p-channel transistors 15, 17 and 19 and n-channel transistors 21, 22 and 23. However, the switching threshold of threshold adaptor stage 13 can change depending on the on or off condition of transistors 17 and 23 which are controlled by the output of the detector stage 11.

The detector stage 11 output is either a low logic level if the signal applied to the $V_X$ input terminal 31 exceeds the threshold of detector stage 11, that is, is close to a voltage $V_{DD}$ of the threshold adaptor stage 13, or is at a logic high level if the signal applied to the $V_X$ input terminal 31 is below the detector stage 11 threshold.

When the output of the detector stage 11 is in a low state, transistor 23 is turned off and transistor 17 is turned on. Since transistor 23 is turned off, transistor 21 is rendered nonconductive. Transistor 15 is, in turn, bypassed by virtue of transistor 17 being on. As a result, the switching threshold for input signals on line 33 is set by the switching characteristics of transistors 19 and 22.

On the other hand, if the output of the detector stage 11 is high, meaning that the voltage at $V_X$ is below the preset threshold then transistor 23 is turned on and transistor 17 is turned off. In this state, the switching level of adaptor stage 13 is set by the switching state established by the series connection of transistors 15 and 19 which is in series with the parallel circuit formed by transistor 22 in parallel with the series connection of transistors 21 and 23.

Transistors 17 and 21 are much larger transistors than the other transistors so that they are effectively on or off switches, so threshold adjustments in each of the two different switching threshold states can be made by selecting the switching characteristics of the remaining transistors 15, 19, 22 and 23.

Thus, depending on the voltage detected by detector stage 11, the threshold of the threshold adaptor stage 13 can be adjusted by switching one of transistors 17 and 23 on and the other off in accordance with the output of detector stage 11 to thereby change the CMOS inverter 9 from a first threshold switching characteristic to a second threshold switching characteristic. Since the voltage on input line 31 represents the level of the logic signals applied to input line 33, an appropriate switching threshold can be set by the threshold adaptor stage 13 so that the output signal at output terminal 29 is appropriate for the logic input signals applied at input line 33.

Figure 5:
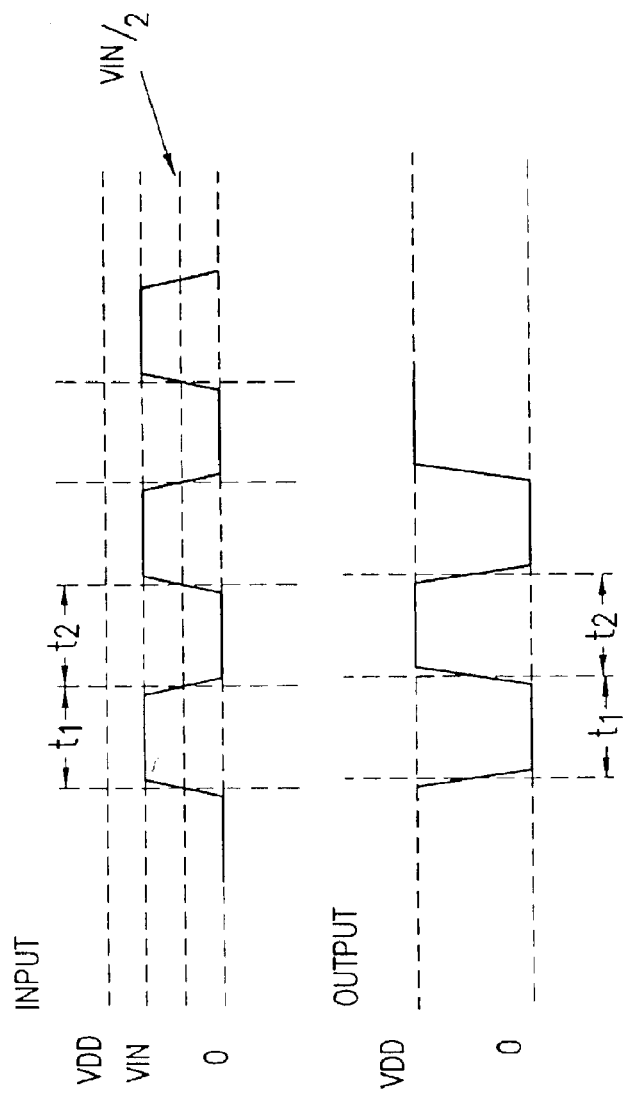
FIG. 5 is a timing diagram illustrating operation of the FIG. 4 circuit.

FIG. 5 illustrates how the threshold voltage of CMOS inverter 6 changes between a first threshold value of $V_{DD}/2$ associated with input logic signals which transition between zero volts and $V_{DD}$, and a second threshold value of $V_{in}/2$ associated with input logic signals which transition between zero volts and $V_{in}$. Transistors 15, 19, 22 and 23 are fabricated to provide these two switching thresholds depending on the on/off states of transistor 17 and 21.

FIG. 4 also shows that one detector stage 11 can control the switching threshold of a plurality of threshold adaptor stages 13.

Figure 6:
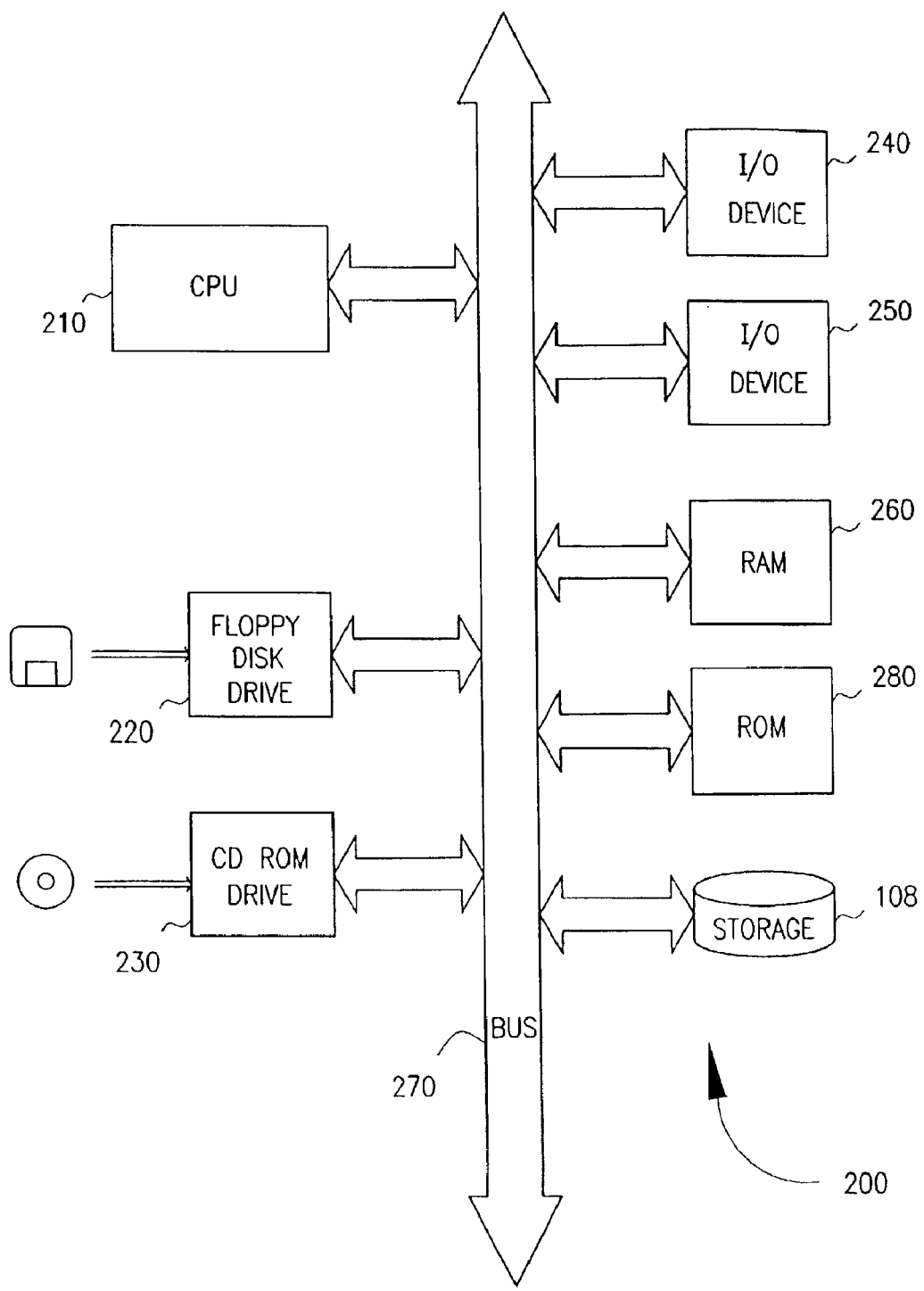
FIG. 6 depicts a processor system containing various components which may employ an adaptive threshold logic circuit of the invention.

The invention may be used in any digital logic circuit, including but not limited to gate circuits, inverters, timing circuits and in larger devices such as a DSP, programmable logic devices, processors, memory devices which include memory cell arrays and peripheral logic coupled to the array, and the like. For example, as shown in FIG. 6, a processor based system, such as a computer system, for example, generally comprises a central processing unit (CPU) 210, for example, a microprocessor, that communicates with one or more input/output (I/O) devices 240, 250 over a bus 270. The computer system 200 also includes random access memory (RAM) 260, a read only memory (ROM) 280 and, in the case of a computer system may include peripheral devices such as a floppy disk drive 220 and a compact disk (CD) ROM drive 230 which also communicate with CPU 210 over the bus 270. At least one of CPU 210 and one or more integrated circuits connected thereto, such as employed for RAM 260 and ROM 280, are preferably constructed as integrated circuits which include an adaptive threshold logic circuit as described above with respect to FIGS. 4 and 5. It may also be desirable to integrate the processor 210 and memory 260 on a single IC chip and have one or both of processor 210 and memory 260 employ the adaptive threshold logic circuit described above with reference to FIGS. 4 and 5.

While an exemplary embodiment of the invention has been described and illustrated above, it should be apparent that many modification substitutions and other variations can be made without departing from the spirit or scope of the invention. Accordingly, the invention is not to be considered as limited by the foregoing description and accompany drawings, and is only limited by the scope of the appended claims.

What is claimed as new and desired to be protected by Letters Patent of the United States is:

1. A method of operating a logic circuit comprising:
   detecting an electrical potential between first and second voltage terminals, said voltage terminals respectively coupled to said logic circuit;
   adjusting a logic threshold voltage of said logic circuit to a particular voltage according to said detected electrical potential, wherein said particular voltage is one of two nominal logic threshold voltages;
   receiving an input signal at an input of said logic circuit; and
   producing an output signal transition at an output of said logic circuit according to said particular voltage and a transition of said input signal, wherein a duty cycle of said output signal is substantially identical to a duty cycle of said input signal.

2. The method of operating said logic circuit as defined in claim 1 wherein said adjusting a logic threshold voltage comprises:

modifying said logic threshold voltage from one of said two nominal threshold voltages to the other of said two nominal threshold voltages.

3. The method of operating said logic circuit as defined in claim 1 wherein a first of said two nominal threshold voltages is substantially equal to one-half of a first detected value of said electrical potential and a second of said two nominal threshold voltages is substantially equal to one half of a second detected value of said electrical potential.

4. The method of operating said logic circuit as defined in claim 1 wherein said transition of said input signal is a signal transition of a first signal and said output signal transition is a transition of a second signal, said first and second signals having substantially identical time intervals between corresponding adjacent zero-crossings.

5. The method of operating said logic circuit as defined in claim 4 wherein said second signal is a logical inverse signal of said first signal.

6. A logic circuit having:
    a logic evaluation circuit adapted to produce a logical output signal in response to a received logical input signal, wherein a duty cycle of said logical output signal is substantially identical to a duty cycle of said received logical input signal;
    a threshold control circuit, said threshold control circuit coupled to said logic evaluation circuit and adapted to adjust a logic threshold of said logic evaluation circuit; and
    a threshold control input coupled to said threshold control circuit and adapted to receive a threshold control signal, said threshold control signal being related to a voltage range of said logical input signal.

7. The logic circuit as defined in claim 6 wherein said threshold control input is adapted to be switchingly coupled to a plurality of supply voltage terminals of a respective plurality of further logic circuits, said plurality of further logic circuits adapted to produce respective portions of said logical input signal during respective time intervals.

8. The logic circuit as defined in claim 7 wherein said plurality of supply voltage terminals each sources one of at least two voltages.

9. The logic circuit as defined in claim 6 wherein said logic evaluation circuit comprises an inverter circuit.

10. A logic circuit comprising:
    a logic input adapted to receive a plurality of logical input signals from a respective plurality of logical signal sources;
    a logic evaluation circuit coupled to said logical input and adapted to produce a logical output signal, said logical output signal including a plurality of signal portions corresponding to said plurality of logical input signals respectively, said logical output signal also having a duty cycle substantially identical to that of a respective logical input signal;
    means for adapting a logical threshold of said logic evaluation circuit to one of a plurality of voltage values according to a plurality of respective voltage swings of said logical signal sources.

11. The logic circuit as defined in claim 10, wherein said plurality of respective voltage swings corresponds to a respective plurality of supply voltages of a respective plurality of voltage supplies, said plurality of voltage supplies coupled to said plurality of logical signal sources respectively.

12. A method of operating a logic circuit, the method comprising:
    receiving at a first input a logical input signal;
    receiving at a second input a voltage signal indicative of a supply voltage of a downstream circuit which provides said logical input signal;
    changing a threshold switching characteristic of said logic circuit from a first threshold switching characteristic to a second threshold switching characteristic based on said received voltage signal;
    transmitting at an output of said logic circuit a logical output signal having a duty cycle substantially identical to a duty cycle of said logical input signal.

13. The method of claim 12, wherein said logical output signal is an inverse logical value of said logical input signal.

14. A method of operating a logic circuit, the method comprising:
    adjusting a logic threshold voltage of said logic circuit based on a received input signal; and
    producing a logical output signal having a first time period between adjacent zero crossings substantially identical to a second time period between adjacent zero crossings of a logical input signal.

15. The method of claim 14, wherein said act of adjusting comprises:
    adjusting said logic threshold voltage based on a received logical input signal and a voltage indicative of a supply voltage from which said logical input signal is, at least in part, generated.

16. A method of operating an inverter circuit comprising:
    receiving a logic input signal at a first input terminal;
    operating said inverter to provide an output signal based on an inversion of said received logic input signal;
    detecting, at a second input terminal, a voltage level representative of a supply voltage level of the logic input signal; and
    changing the switching characteristics of said inverter if an operating voltage level of a circuit which supplies said input signal is below an operating voltage level of said inverter by a predetermined amount.

17. The method of claim 16 further comprising controlling predetermined transistors of said inverter to set a threshold switching level for said inverter in accordance with the operating voltage level of said circuit which supplies said input signals.

18. A method of claim 17 wherein said inverter is a CMOS inverter which has a first plurality of p-channel transistors and a second plurality of n-channel transistors, at least one of said p-channel transistors and at least one of said n-channel transistors being controlled to set said threshold level.

* * * * *